US010141263B2

(12) United States Patent
Hung et al.

(10) Patent No.: US 10,141,263 B2
(45) Date of Patent: Nov. 27, 2018

(54) METHOD FOR FABRICATING SEMICONDUCTOR DEVICE

(71) Applicant: UNITED MICROELECTRONICS CORP., Hsin-Chu (TW)

(72) Inventors: Ching-Wen Hung, Tainan (TW); Jia-Rong Wu, Kaohsiung (TW); Yi-Hui Lee, Taipei (TW); Ying-Cheng Liu, Tainan (TW); Chih-Sen Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/894,940

(22) Filed: Feb. 13, 2018

(65) Prior Publication Data
US 2018/0174970 A1 Jun. 21, 2018

Related U.S. Application Data

(62) Division of application No. 15/285,471, filed on Oct. 4, 2016, now Pat. No. 9,941,215.

(30) Foreign Application Priority Data
Sep. 8, 2016 (CN) .......................... 2016 1 0810283

(51) Int. Cl.
| H01L 29/66 | (2006.01) |
| H01L 23/535 | (2006.01) |
| H01L 21/768 | (2006.01) |
| H01L 21/8238 | (2006.01) |
| H01L 23/528 | (2006.01) |
| H01L 27/092 | (2006.01) |

(Continued)

(52) U.S. Cl.
CPC ...... *H01L 23/535* (2013.01); *H01L 21/76805* (2013.01); *H01L 21/76829* (2013.01); *H01L 21/76895* (2013.01); *H01L 21/823871* (2013.01); *H01L 23/485* (2013.01); *H01L 23/528* (2013.01); *H01L 27/092* (2013.01); *H01L 29/66545* (2013.01); *H01L 23/53223* (2013.01); *H01L 23/53238* (2013.01); *H01L 23/53266* (2013.01)

(58) Field of Classification Search
CPC ..................... H01L 29/42372; H01L 29/6653
See application file for complete search history.

(56) References Cited

U.S. PATENT DOCUMENTS 7,582,567 B1 * 9/2009 Syau ............... H01L 21/823425
                                                          438/595
8,921,947 B1    12/2014 Hung et al.
(Continued)

OTHER PUBLICATIONS

Hung, Title of Invention: Semiconductor Structure, U.S. Appl. No. 14/880,275, filed Oct. 11, 2015.

*Primary Examiner* — Thomas L Dickey
(74) *Attorney, Agent, or Firm* — Winston Hsu

(57) ABSTRACT

A method for fabricating semiconductor device includes the steps of: providing a substrate; forming a first gate structure on the substrate, a first spacer around the first gate structure, and an interlayer dielectric (ILD) layer around the first spacer; performing a first etching process to remove part of the ILD layer for forming a recess; performing a second etching process to remove part of the first spacer for expanding the recess; and forming a contact plug in the recess.

10 Claims, 4 Drawing Sheets

(51) Int. Cl.
*H01L 23/485* (2006.01)
*H01L 23/532* (2006.01)

(56) References Cited

U.S. PATENT DOCUMENTS

2009/0039511 A1* 2/2009 Jeon .................. H01L 27/115
                                              257/741
2015/0060974 A1   3/2015 Sung
2017/0194211 A1   7/2017 Lai

* cited by examiner

METHOD FOR FABRICATING SEMICONDUCTOR DEVICE

CROSS REFERENCE TO RELATED APPLICATIONS

This application is a division of U.S. application Ser. No. 15/285,471 filed Oct. 4, 2016, and incorporated herein by reference in its entirety.

BACKGROUND OF THE INVENTION

1. Field of the Invention

The invention relates to a semiconductor device, and more particularly to the bottom surface of a contact plug of semiconductor device having reverse V-shaped profile.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

As the semiconductor industry enters 10 nm node generation, the contact area of contact plugs largely decreases and results in resistance increase. The quantity of masks used during contact plug formation also increases substantially, creating larger shift in resistance particularly in the active region and affecting the performance of the device. Hence, how to effectively resolve this issue has become an important task in this field.

SUMMARY OF THE INVENTION

According to an embodiment of the present invention, a method for fabricating semiconductor device is disclosed. First, a substrate is provided, a first gate structure is formed on the substrate, a first spacer is formed around the first gate structure, and an interlayer dielectric (ILD) layer is formed around the first spacer. Next, a first etching process is performed to remove part of the ILD layer for forming a recess, a second etching process is performed to remove part of the first spacer for expanding the recess, and a contact plug is formed in the recess.

According to another aspect of the present invention, a semiconductor device is disclosed. The semiconductor device includes: a substrate; a first gate structure on the substrate; a first spacer around the first gate structure; an interlayer dielectric (ILD) layer around the first spacer; a contact plug on the first gate structure, the first spacer, and the ILD layer. Preferably, a bottom surface of the contact plug includes a reverse V-shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
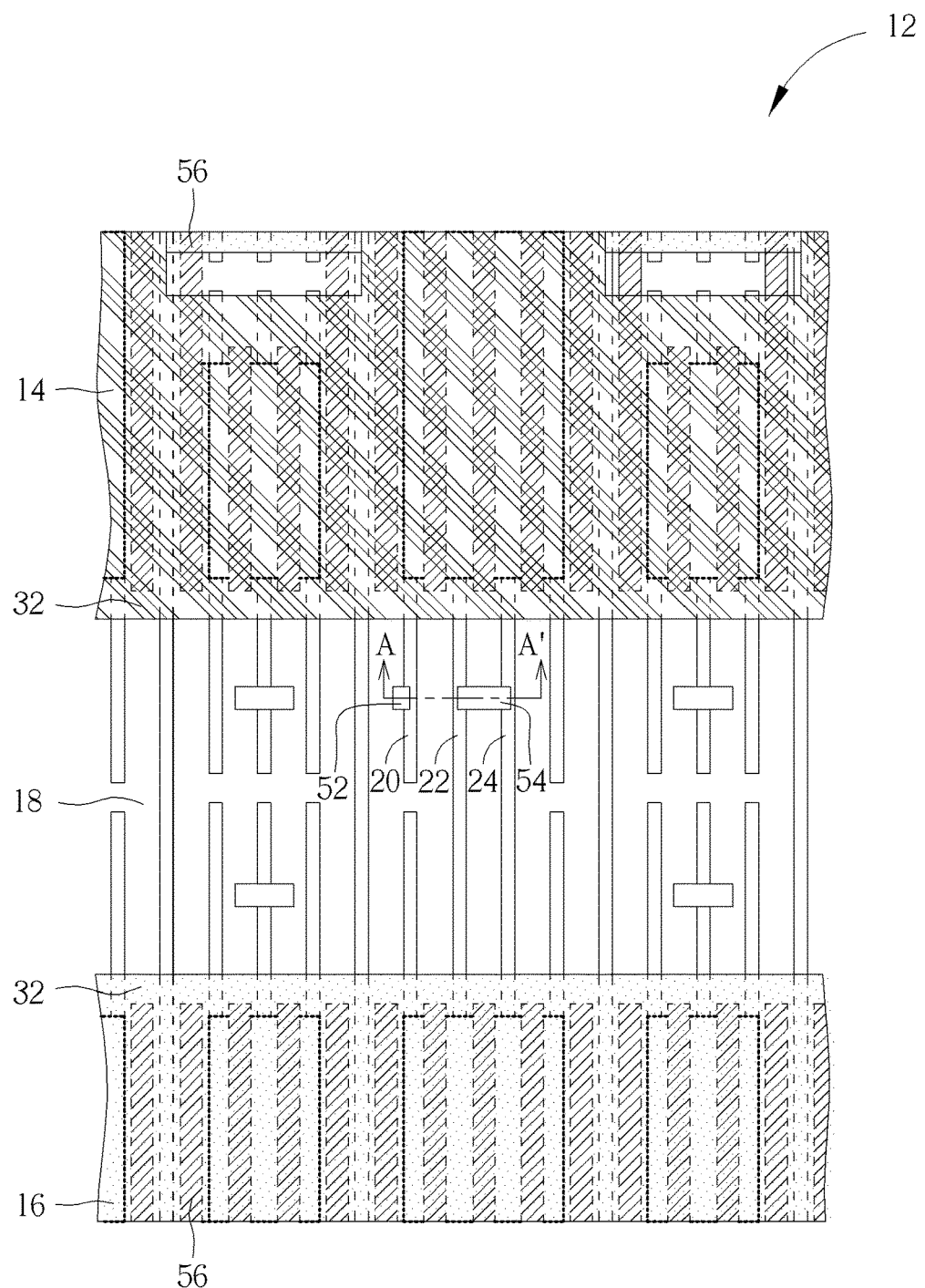
FIG. 1 illustrates a top view of a semiconductor device according to a preferred embodiment of the present invention.

Referring to FIGS. 1-7, FIG. 1 illustrates a top view of a semiconductor device according to a preferred embodiment of the present invention, and FIGS. 2-7 are cross-section views illustrating a method for fabricating the semiconductor device along the sectional line AA' in FIG. 1. As shown in FIGS. 1-7, a substrate 12, such as a silicon substrate or silicon-on-insulator (SOI) substrate is provided. At least an active region (not shown) is preferably defined on the substrate for fabricating a static random access memory (SRAM) in the later process. The active region could further includes a p-type metal oxide semiconductor (PMOS) region 14 and a n-type metal oxide semiconductor (NMOS) region 16, and a shallow trench isolation (STI) 18 made of material such as silicon oxide is formed to surround the PMOS region 14 and the NMOS region 16.

It should be noted that even though this embodiment pertains to the fabrication of a planar MOS transistor, it would also be desirable to apply the process of this embodiment to a non-planar device such as a FinFET device by forming at least a fin-shaped structure on the active region of the substrate 12 and a STI 18 surrounding the bottom portions of the fin-shaped structure, which is also within the scope of the present invention.

Preferably, the fin-shaped structure of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure 14 are all within the scope of the present invention.

Next, a plurality of gate structures, such as gate structures 20, 22, 24 or dummy gates are formed on the substrate 12. Preferably, the gate structures 20, 22, 24 could be formed on the PMOS region 14, the NMOS region 16, or on both PMOS region 14 and NMOS region 16 at the same time. It should be noted that a fabrication process pertaining to the gate structures 20, 22, 24 disposed on the STI 18 is explained below.

Figure 2:
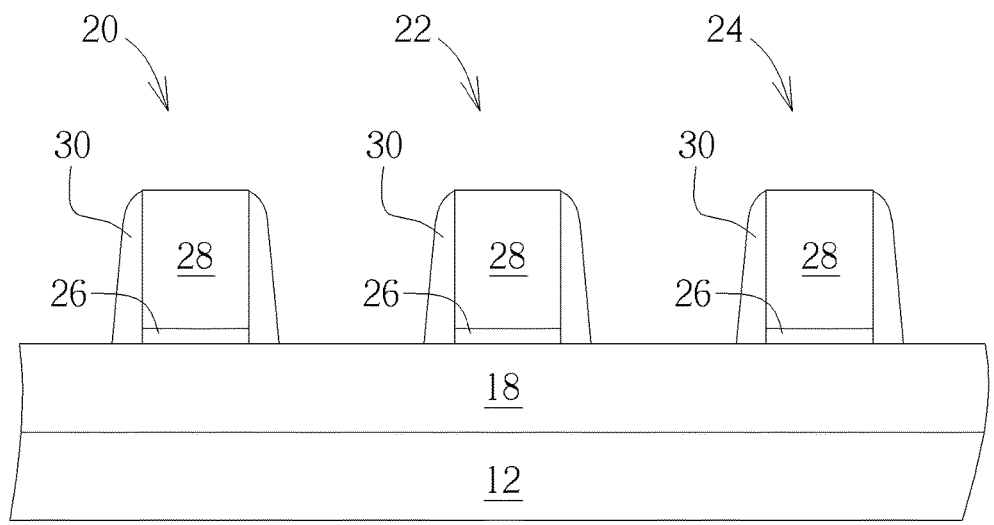
FIGS. 2-7 are cross-section views illustrating a method for fabricating the semiconductor device along the sectional line AA' in FIG. 1.

As shown in FIG. 2, the formation of the gate structures 20, 22, 24 could be accomplished by a gate first process, a high-k first approach from gate last process, or a high-k last approach from gate last process. Since this embodiment pertains to a high-k last approach, it would be desirable to sequentially deposit a gate dielectric layer or interfacial layer, a gate material layer, and a selective hard mask on the substrate 12, conduct a pattern transfer process by using a patterned resist (not shown) as mask to remove part of the gate material layer and part of the gate dielectric layer, and then strip the patterned resist to form gate structures 20, 22, 24 on the STI 18. Each of the gate structures 20, 22, 24 preferably includes a patterned gate dielectric layer 26 and a patterned gate material layer 28.

Next, at least a spacer 30 is formed on the sidewalls of each of the gate structures 20, 22, 24, a source/drain region 32 and/or epitaxial layer (not shown) is formed in the substrate 12 adjacent to two sides of the spacer 30 on the active region, and a selective silicide (not shown) is formed on the surface of the source/drain region 32 and/or epitaxial layer. In this embodiment, the spacer 30 could be a single spacer or a composite spacer. For instance, the spacer 30 could further include an offset spacer (not shown) and a main spacer (not shown). Despite the spacer 30 in this embodiment is preferably made of silicon nitride, the spacer 30 could be selected from the group consisting of $SiO_2$, SiON, and SiCN. The source/drain region 32 and epitaxial layer could include different dopants or different material depending on the type of transistor being fabricated. For instance, the source/drain region 32 could include p-type or n-type dopants and the epitaxial layer could include SiGe, SiC, or SiP.

Figure 3:
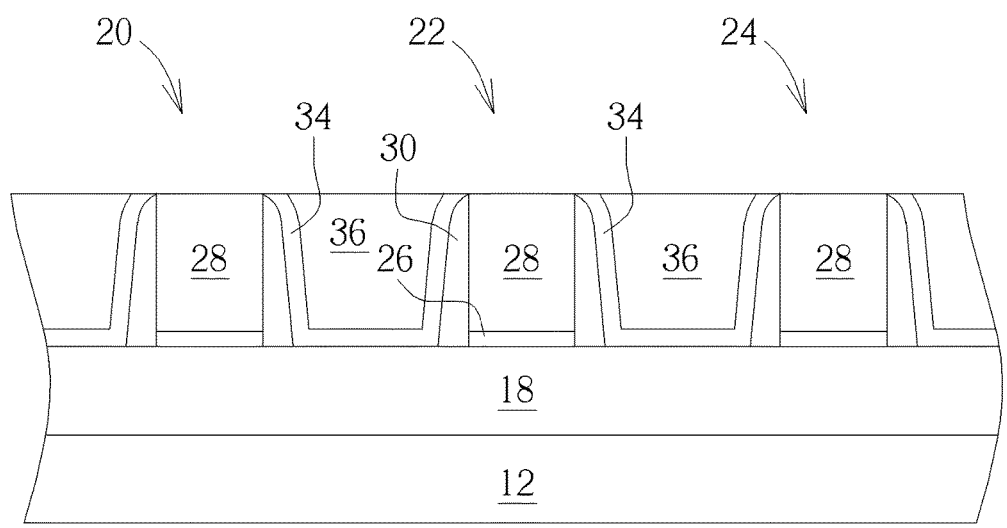

Next, as shown in FIG. 3, a contact etch stop layer (CESL) 34 composed of silicon nitride is formed on the substrate 12 to cover the gate structures 20, 22, 24, and an interlayer dielectric layer 36 is formed on the CESL 34. Next, a planarizing process, such as chemical mechanical polishing (CMP) process is conducted to remove part of the ILD layer 36 and part of the CESL 34 to expose the gate material layer 28 made of polysilicon, in which the top surface of the gate material layer 28 and the top surface of the ILD layer 36 are coplanar.

Figure 4:
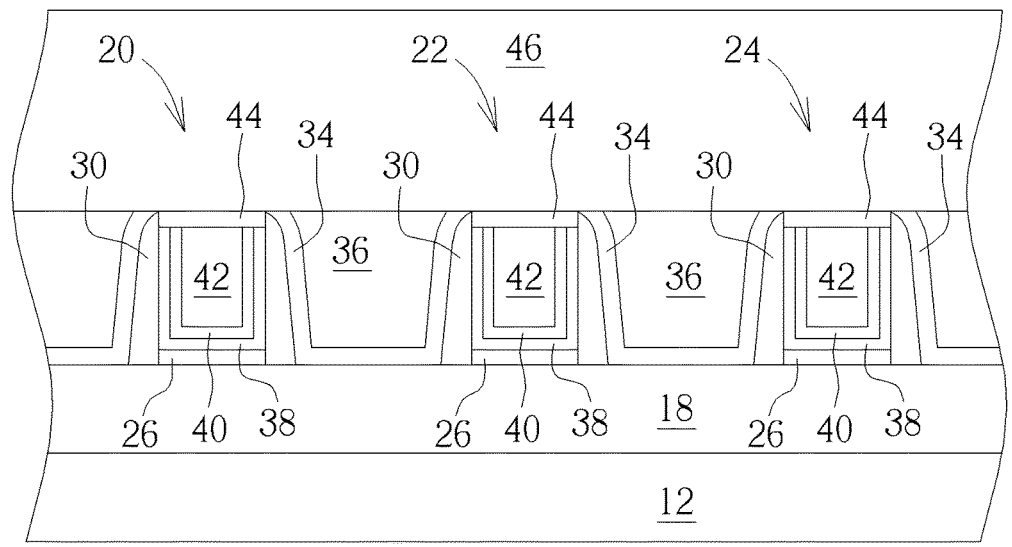

Next, a replacement metal gate (RMG) process is conducted to transform the gate structures 20, 22, 24 into metal gates. For instance, as shown in FIG. 4, a selective dry etching or wet etching process could be conducted by using etchant including ammonium hydroxide ($NH_4OH$) or tetramethylammonium hydroxide (TMAH) to remove the gate material layer 28 of gate structures 20, 22, 24 for forming recesses (not shown) in the ILD layer 36. Next, a high-k dielectric layer 38, a work function metal layer 40, and a low resistance metal layer 42 are sequentially formed in the recesses, and a planarizing process such as CMP is conducted to remove part of the low resistance metal layer 42, part of the work function metal layer 40, and part of the high-k dielectric layer 38 to form metal gates. Since this embodiment pertains to a high-k last process, each of the gate structures 20, 22, 24 preferably includes an interfacial layer or gate dielectric layer 26, a U-shaped high-k dielectric layer 38, a U-shaped work function metal layer 40, and a low resistance metal layer 42.

In this embodiment, the high-k dielectric layer 38 is preferably selected from dielectric materials having dielectric constant (k value) larger than 4. For instance, the high-k dielectric layer 38 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 40 is formed for tuning the work function of the later formed metal gates to be appropriate in an NMOS or a PMOS. For an NMOS transistor, the work function metal layer 40 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 40 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 40 and the low resistance metal layer 42, in which the material of the barrier layer may include titanium (Ti), titanium nitride (TiN), tantalum (Ta) or tantalum nitride (TaN). Furthermore, the material of the low-resistance metal layer 42 may include copper (Cu), aluminum (Al), titanium aluminum (TiAl), cobalt tungsten phosphide (CoWP) or any combination thereof.

Next, an etching process is conducted to remove part of the high-k dielectric layer 38, part of the work function metal layer 40, and part of the low resistance metal layer 42 to form recess (not shown), and hard masks 44 are deposited into the recesses so that that top surfaces of the hard masks 44 and ILD layer 36 are coplanar. Preferably, the hard masks 44 could include material such as but not limited to for example, $SiO_2$, SiN, SiON, SiCN, or combination thereof. Next, a dielectric layer or cap layer 46 is formed on the ILD layer 36, in which the cap layer 46 preferably includes oxides such as TEOS, but not limited thereto.

Figure 5:
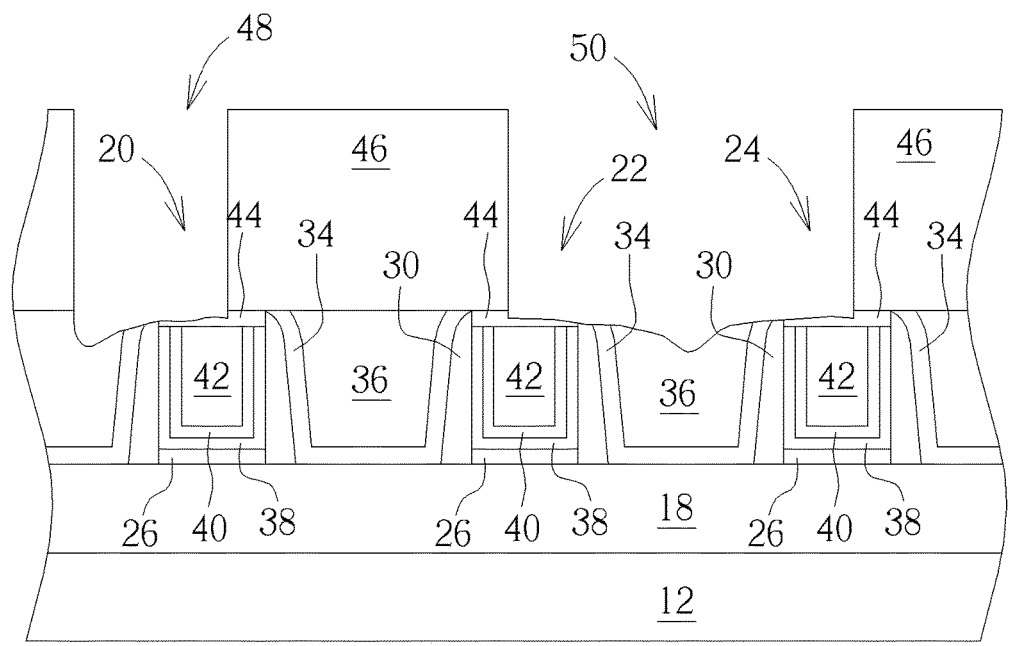

Next, as shown in FIG. 5, a patterned mask (not shown), such as a patterned resist is formed on the cap layer 46, and a first etching process is conducted by using the patterned resist as mask to remove part of the cap layer 46 and part of the ILD layer 36 for forming recesses 48 and 50. According to a preferred embodiment of the present invention, the first etching process uses an etchant having high selectivity or high etching rate against oxide materials while having low selectivity or low etching rate against nitride materials to form the recesses 48 and 50. In other words, the first etching process preferably removes part of the cap layer 46 and part of the ILD layer 36 made of oxides while not removing any or only a little portion of adjacent elements made of non-oxide material, such as CESL 34 and spacer 30. By doing so, the depth of the recesses 48 and 50 extended downward into the ILD layer 36 is preferably greater than the depth of recesses 48 and 50 extended downward into the CESL 34 and/or spacer 30. In this embodiment, the etchant used in the first etching process is selected from the group consisting of $C_4F_6$, $O_2$, and Ar.

Figure 6:
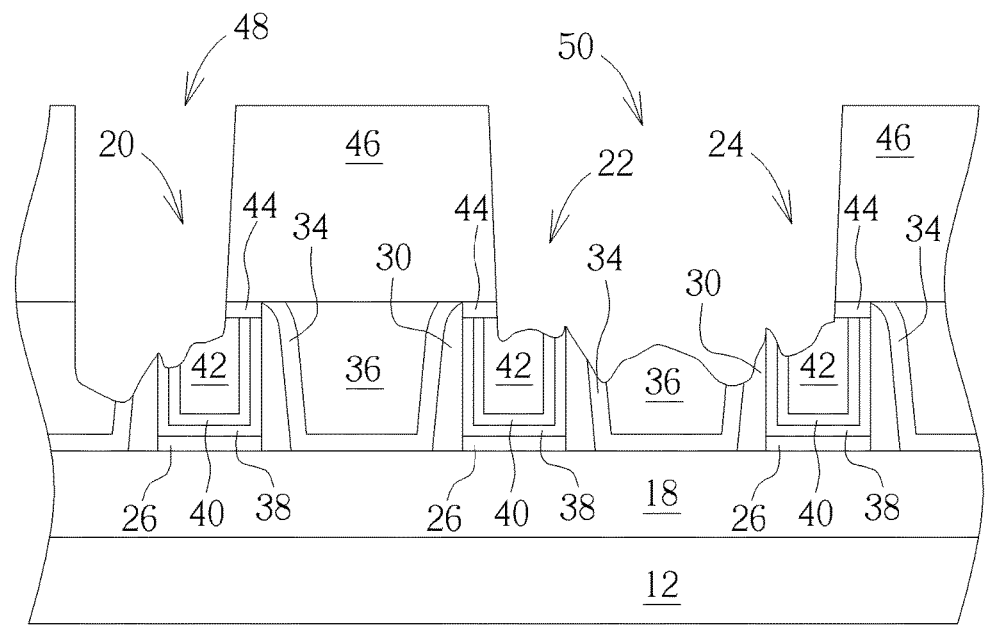

Next, as shown in FIG. 6, a second etching process is conducted to remove part of the spacer 30 and extend or enlarge the previously formed recesses 48 and 50. Preferably, the second etching process uses an etchant having high selectivity or high etching rate against nitride materials while having low selectivity or low etching rate against oxide materials to enlarge the recesses 48 and 50. In other words, the second process preferably removes part of the hard masks 44, part of the CESL 34, and part of the spacers 30 while not removing any or only a little portion of the adjacent elements made of non-nitride material such as the ILD layer 36. By doing so, the bottom of the recesses 48 and 50 which was extended more into the ILD layer 36 now extends more into the CESL 34 and spacers 30 after the second etching process. After the second etching process is completed, the bottom of the recess 50 between gate structure 22 and gate structure 24 in particular now reveals a substantially wave-like profile and the bottom surface of the recess 50 directly on top of the ILD layer 36 includes at least a reverse V-shaped profile.

Figure 7:
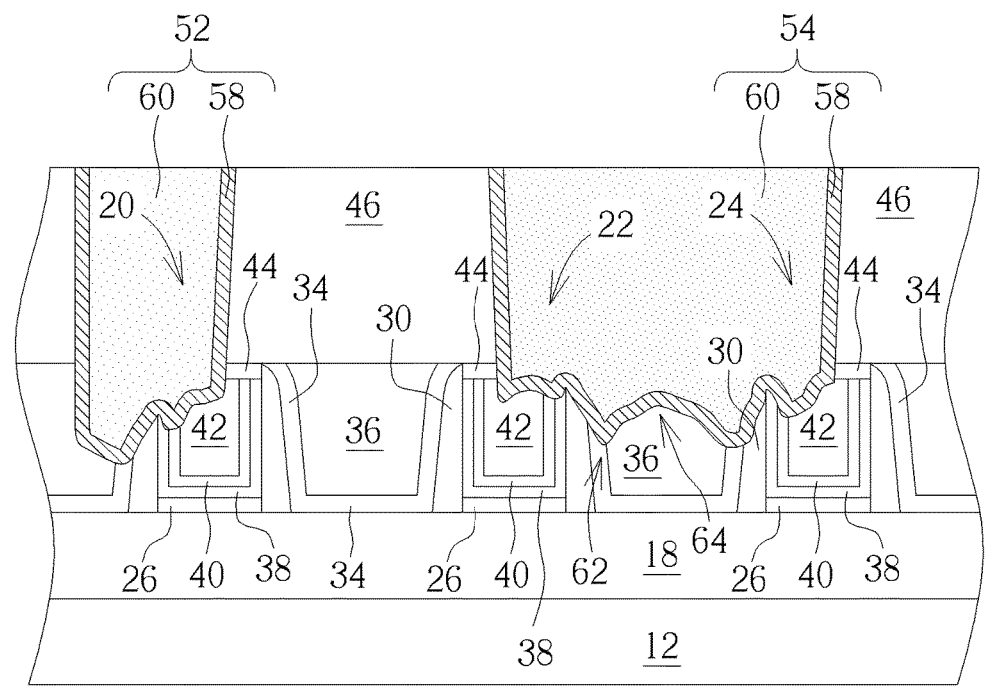

Next, as shown in both FIG. 7 and FIG. 1, a contact plug formation is conducted to form contact plugs 52 and 54 into the recesses 48 and 50 and a contact plug 56 electrically connected to the source/drain region 32 on the active region. In this embodiment, the formation of the contact plugs 52, 54, 56 could be accomplished by sequentially depositing a barrier layer 58 and a metal layer 60 into the recesses 48 and 50, and then conducting a planarizing process such as CMP to remove part of the metal layer 60, part of the barrier layer 58, and even part of the cap layer 46 to form contact plugs 52 and 54 in the recesses 48 and 50, in which the top surfaces of the contact plugs 52 and 54 and the cap layer 46 are coplanar. In this embodiment, the barrier layer 58 is selected from the group consisting of Ti, Ta, TiN, TaN, and WN, and the metal layer 60 is selected from the group consisting of Al, Ti, Ta, Nb, Mo, and Cu. This completes the fabrication of a semiconductor device according to a preferred embodiment of the present invention.

Referring again to FIG. 7, which further illustrates a structural view of a semiconductor device according to a preferred embodiment of the present invention. As shown in the portion especially between the gate structures 22 and 24 in FIG. 7, the semiconductor device preferably includes a substrate 12, a STI 18 on the substrate 12, gate structures 22 and 24 on the STI 18, hard masks 44 on the gate structures 22 and 24, spacers 30 surrounding the gate structures 22 and 24, a CESL 34 and ILD layer 36 between the spacers 30, and a contact plug 54 on the gate structures 22 and 24, the spacers 30, and the ILD layer 36.

Viewing from an even more detailed perspective, the top surface of the hard masks 44 is even with the top surfaces of the CESL 34 and ILD layer 36, and the contact plugs 54 are formed to contact the conductive materials including but not limited to for example work function metal layer 40 and low resistance metal layer 42 within the gate structures 22 and 24, the hard masks 44, the spacers 30, the CESL 34, and the ILD layer 36 directly.

Moreover, the bottom surface of the contact plug 54 preferably reveals a wave-like or wavy profile, in which the wavy profile further includes both V-shaped profile 62 and reverse V-shaped profile 64. Specifically, the bottom surface of the contact plug 54 directly on top of the ILD layer 36 includes a reverse V-shaped profile 64 and the bottom surface of the contact plug 54 connecting two sides of the reverse V-shaped profile 64 and extended downward into the CESL 34 includes V-shaped profiles 62. Preferably, the peak point of the reverse V-shaped profile 64 is formed directly on top of the ILD layer 36 while the valley point of the V-shaped profile 62 is directly on and contacting the CESL 34. Nevertheless, the valley point of the V-shaped profile 62 could also be adjusted to be on and contacting the adjacent spacers 30 or even on and contacting both the CESL 34 and spacers 30 at the same time, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a first gate structure on the substrate, a first spacer around the first gate structure, and an interlayer dielectric (ILD) layer around the first spacer;
   performing a first etching process to remove part of the ILD layer for forming a recess;
   performing a second etching process to remove part of the first spacer for expanding the recess after performing the first etching process; and
   forming a contact plug in the recess.

2. The method of claim 1, further comprising:
   forming a second gate structure on the substrate, a second spacer around the second gate structure, and the ILD layer around the first spacer and the second spacer;
   performing the first etching process to remove part of the ILD layer between the first gate structure and the second gate structure;
   performing the second etching process to remove part of the first spacer and part of the second spacer; and
   forming the contact plug.

3. The method of claim 2, further comprising:
   forming a contact etch stop layer (CESL) on the first spacer and the second spacer before forming the ILD layer;
   performing the first etching process;
   performing the second etching process to remove part of the CESL, part of the first spacer, and part of the second spacer; and
   forming the contact plug.

4. The method of claim 3, wherein the contact plug contacts the first gate structure, the second gate structure, the CESL, and the ILD layer directly.

5. The method of claim 2, further comprising:
   forming a first hard mask on the first gate structure and a second hard mask on the second gate structure, wherein the top surfaces of the first hard mask, the second hard mask, and the ILD layer are coplanar;
   performing the first etching process;
   performing the second etching process to remove part of the first hard mask, part of the second hard mask, part of the first spacer, and part of the second spacer; and
   forming the contact plug.

6. The method of claim 5, wherein the contact plug contacts the first gate structure, the first hard mask, the second gate structure, the second hard mask, and the ILD layer directly.

7. The method of claim 2, wherein the contact plug contacts the first gate structure, the second gate structure, and the ILD layer directly.

8. The method of claim 1, wherein an etchant of the first etching process is selected from the group consisting of $C_4F_6$, $O_2$, and Ar.

9. The method of claim 1, wherein an etchant of the second etching process is selected from the group consisting of $CH_2F_2$ and $H_2$.

10. The method of claim 1, wherein a bottom surface of the contact plug comprises a reverse V-shape.

* * * * *